United States Patent
Nishikata et al.

[11] Patent Number: 5,789,765
[45] Date of Patent: Aug. 4, 1998

[54] PHOTO DIODE PROVIDING HIGH-LINEARITY SIGNAL CURRENT IN RESPONSE TO LIGHT RECEIVING SIGNAL

[75] Inventors: Kazuaki Nishikata, Yokosuka; Michinori Irikawa, Yokohama, both of Japan

[73] Assignee: The Furukawa Electric Co., Ltd., Tokyo, Japan

[21] Appl. No.: 763,217

[22] Filed: Dec. 10, 1996

[30] Foreign Application Priority Data

Dec. 21, 1995 [JP] Japan ............... 7-333592

[51] Int. Cl.$^6$ .............. H01L 27/15; H01L 31/12; H01L 31/153; H01L 33/00
[52] U.S. Cl. .............. 257/86; 257/103; 257/458
[58] Field of Search .............. 257/86, 103, 458

[56] References Cited

U.S. PATENT DOCUMENTS

| | | |
|---|---|---|
| 3,398,310 | 8/1968 | Larsen et al. .............. 257/86 |
| 4,365,260 | 12/1982 | Holonyak, Jr. .............. 257/86 |
| 5,329,135 | 7/1994 | Terakado .............. 257/86 |

FOREIGN PATENT DOCUMENTS 5175548  7/1993  Japan.

*Primary Examiner*—Stephen Meier
*Attorney, Agent, or Firm*—Frishauf, Holtz, Goodman, Langer & Chick, P.C.

[57] ABSTRACT

A photo diode in which an optical absorption layer and a p-type semiconductor layer neighboring on each other are designed to be at almost the same valence band level (their offset not exceeding 0.05 eV). Preferably the optical absorption layer is a GaInAsP layer with an absorption edge wavelength of 1.65 to 1.55 μm, and the p-type semiconductor layer and lattice-matching with the preceding semiconductor layer are each an AlGaInAs layer with an absorption edge wavelength of 1.55 to 1.30 μm remaining shorter than that of the optical absorption layer.

14 Claims, 5 Drawing Sheets

- 28 (Ti/Pt/Au)
- 27 (SiN)
- 26
- Zn
- 25 (n-InP)
- 24 (n-AlGaInAs)
- 23 (n-GaInAs)
- 22 (n-InP)
- 21 (SUBSTRATE)
- 29 (AuGeNi/Au)

FIG.8
(PRIOR ART)

- 17 (Ti/Pt/Au)
- 19 ($p^+$-GaInAs)
- 16 (p-InP)
- 15 (p-GaInAsP)
- L → 14 (i-InGaAs)
- 13 (n-GaInAsP)
- 12 (n-InP)
- 11 (n-InP)
- 18 (AuGeNi/Au)

PHOTO DIODE PROVIDING HIGH-LINEARITY SIGNAL CURRENT IN RESPONSE TO LIGHT RECEIVING SIGNAL

BACKGROUND OF THE INVENTION

1. Field of the Invention

The present invention relates to a photo diode of pin construction, which provides a high-linearity signal current in response to the light receiving signal and achieves wide band and high speed. More particularly, the present invention relates to a photo diode of pin construction, which prevents unnecessary pileup of holes at the interface (or boundary) between an optical absorption layer and a p-type semiconductor layer adjacent to the optical absorption layer to eliminate the modulation distortion of signal current.

2. Description of the Prior Art

Figure 8:
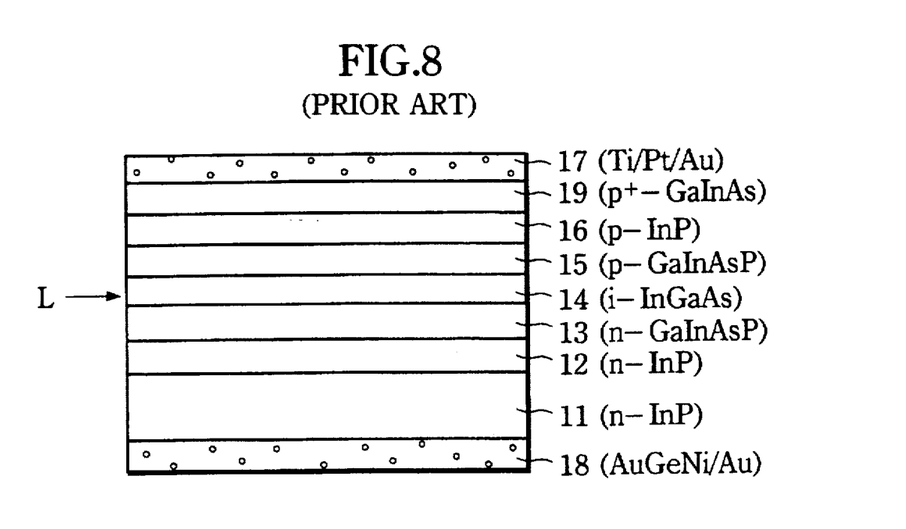
FIG. 8 is a sectional view showing a construction of a conventional photo diode.

A photo diode of pin construction has a multilayer construction in which an i-type semiconductor layer with low carrier concentration is held between a p-type semiconductor layer and an n-type semiconductor layer. In particular, a photo diode of optical wave guide type is constructed, for example, as shown in FIG. 8, by making the epitaxial growth of an n-type InP layer 12, n-type GaInAsP layer 13, InGaAs layer 14, p-type GaInAsP layer 15, p-type InP layer 16, and $p^+$-type GaInAs layer 19 on a n-type InP substrate 11 in sequence. A p-electrode 17 of this photo diode is formed on the aforementioned $p^+$-type GaInAs layer 19, and a n-electrode 18 is formed on the lower surface (or back surface) of the n-type InP substrate 11. Ti/Pt/Au is used as the p-electrode 17, and AuGeNi/Au is used as the n-electrode 18.

The aforementioned InGaAs layer 14 is a semiconductor layer of low impurity concentration, which has an optical absorption edge wavelength enough to receive light, and has bandgap energy determined accordingly, functioning as an optical absorption layer. The n-type GaInAsP layer 13 and p-type GaInAsP layer 15 adjacent to this optical absorption layer are optical confinement layers, in which the aforementioned GaInAsP is used as a semiconductor which has a refractive index lower than that of the optical absorption layer and does not absorb incident light to efficiently guide the incident light inside a photo diode. The n-type InP layer 12 and p-type InP layer 16 are cladding layers, which play a role for efficiently confining the incident light in the optical absorption layer and the optical confinement layer to accelerate optical absorption. For this reason, the aforementioned InP is used for the cladding layer because it is a semiconductor having a refractive index lower than those of the optical absorption layer and the optical confinement layers.

The photo diode of the aforementioned construction is used by applying a reverse bias voltage between the aforesaid p-electrode 17 and n-electrode 18. This reverse bias voltage forms a depletion layer in the optical absorption layer. When light L is incidented on the end face of photo diode in this state, this light L is guided to a core layer consisting of the optical absorption layer and the optical confinement layer, and enters the optical absorption layer. Then, in the depletion layer in the optical absorption layer, photoelectric transfer occurs by receiving optical energy, and a signal charge in accordance with the quantity of light is produced. This signal charge is outputted as a signal current via the aforementioned p-electrode 17 and n-electrode 18.

Of the signal charges, holes especially having a large mass sometimes produce an unnecessary pileup before reaching the p-electrode 17. When a potential spike of band in the p-type GaInAsP layer 15, which is a optical wave guide layer, and the p-type InP layer 16, which is a cladding layer, is large, this unnecessary pileup of holes is produced at the interface therebetween. When a potential spike of band in the p-type GaInAsP layer 15, which is a optical wave guide layer, and the InGaAs layer 14, which is an optical absorption layer, is large, the unnecessary pileup of holes is produced at the interface therebetween. This unnecessary pileup of hole is responsible for the distortion of the aforesaid signal current.

However, of the signal charges, an electron, which has a small mass, scarcely affects the distortion of the signal current.

SUMMARY OF THE INVENTION

An object of the present invention is to provide an optical wave guide type photo diode of pin construction which can obtain a high-linearity signal current, that is, a distortionless (low modulation distortion) signal current in response to the light receiving signal without the unnecessary pileup of holes.

In particular, in the present invention, paying attention to the fact that the potential spike at the interface between the optical absorption layer and the optical wave guide layer depends greatly on the band offset at the optical absorption layer and the optical wave guide layer, there is provided a photo diode of pin construction in which the difference in valence band level between the optical absorption layer and the p-type semiconductor layer adjacent to the optical absorption layer is not larger than 0.05 eV.

The width of distribution of energy which the hole has at ordinary temperatures is about 2 times the thermal energy (about 0.025 eV) at ordinary temperatures, which is expressed by the product of Boltzmann's constant k and temperature T. Therefore, the present invention provides a photo diode, in which the conduction of holes is done by thermal energy, for example, even in a state in which a bias voltage is not applied, so that the occurrence of distortion responsible for the unnecessary pileup of holes is restrained.

Specifically, there is provided a photo diode of pin construction, in which the valence band level of each layer is made equal by using GaInAsP of a low impurity concentration as a semiconductor forming the optical absorption layer and by using p-type AlInAsP as the P-type semiconductor layer, or the difference in valence band level of each layer is decreased to a substantially negligible extent, so as to prevent the occurrence of unnecessary pileup of holes at the interface.

Preferably, the optical absorption layer consists of a GaInAsP layer with an absorption edge wavelength of 1.65 to 1.55 μm, and the p-type semiconductor layer consists of a p-type AlGaInAs layer with an absorption edge wavelength shorter than that of the optical absorption layer, being 1.55 to 1.30 μm. This provides a photo diode of pin construction for detecting a light signal with a wavelength of 1.55 μm with high linearity.

Alternatively, the optical absorption layer consists of a GaInAsP layer with an absorption edge wavelength of 1.56 to 1.36 μm, and the p-type semiconductor layer consists of a p-type AlGaInAs layer with an absorption edge wavelength of 1.30 to 1.14 μm. This provides a photo diode of pin construction for detecting a light signal with a wavelength of 1.3 μm with high linearity.

More specifically, the present invention provides a photo diode, comprising:

an n cladding layer consisting of an n-type InP layer or an n-type AlInAs layer formed on an n-type InP substrate;

an n optical confinement layer consisting of an n-type GaInAsP layer or an n-type AlGaInAs layer formed on the n cladding layer, which does not absorb light with a wavelength of 1.55 μm (or 1.3 μm) and lattice matches with the n cladding layer;

an optical absorption layer consisting of a non-doped or n-type low-concentration doped GaInAs layer or GaInAsP layer formed on the n optical wave guide layer, which absorbs light with a wavelength of 1.55 μm (or 1.3 μm) and lattice matches with the n optical wave guide layer;

a p optical wave guide layer consisting of a p-type AlGaInAs layer formed on the optical absorption layer, which does not absorb light with a wavelength of 1.55 μm (or 1.3 μm) and lattice matches with the optical absorption layer; and a p cladding layer consisting of a p-type GaInAsP layer or a p-type AlInAs layer or an InP layer formed on the p optical wave guide layer, which does not absorb light with a wavelength of 1.55 μm (or 1.3 μm) and lattice matches with the p optical wave guide layer, wherein light is incident in parallel with each layer.

Also, the present invention provides a waveguide photo-diode that comprises aforementioned semiconductor layers inversely on a p-type InP substrate.

The present invention also provides a face incident type photo diode, comprising:

an optical absorption layer consisting of a non-doped or n-type low-concentration doped GaInAs layer or GaInAsP layer formed on an n-type InP substrate; an AlGaInAs layer with an absorption edge wavelength of 1.55 to 1.14 μm formed on the optical absorption layer; and a p-type region formed in the AlGaInAs layer, which is formed by diffusion or implant doping of p-type impurities.

DETAILED DESCRIPTION OF THE INVENTION

Figure 1:
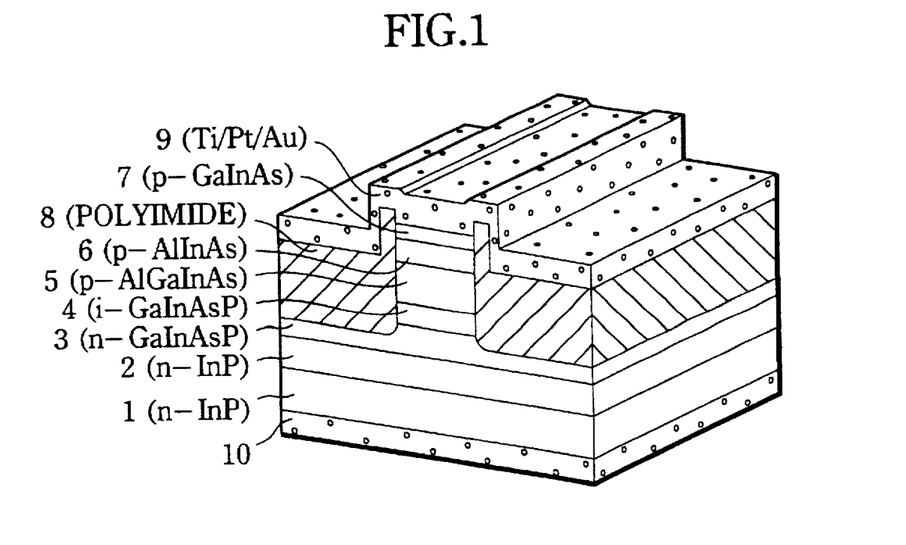
FIG. 1 is a view showing a construction of a photo diode in accordance with one embodiment of the present invention.

A photo diode of pin construction in accordance with one embodiment of the present invention has a multilayer construction as shown in FIG. 1.

Figure 2:
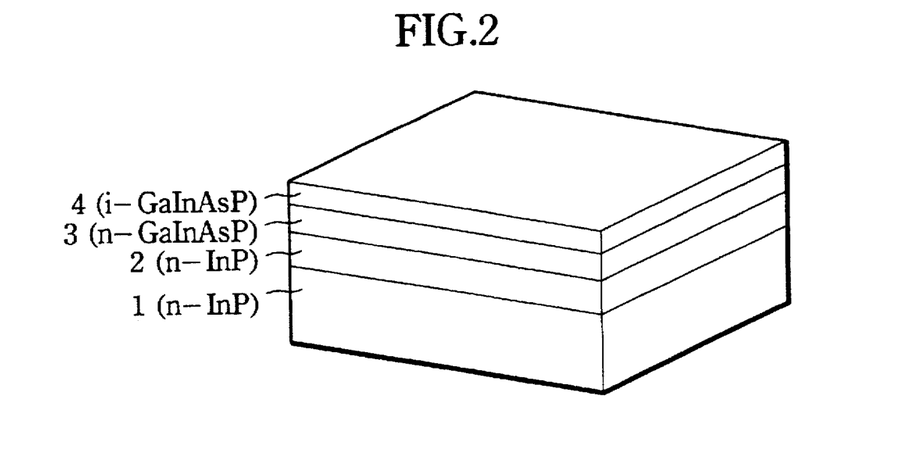
FIG. 2 is a view showing a state of a first stage in the manufacturing process for the photo diode shown in FIG. 1.

Specifically, when a light receiving element for detecting light with a wavelength of 1.55 μm is constructed, as a first stage, the epitaxial growth of an n cladding layer 2 consisting of n-type InP layer with a carrier concentration of $1\times10^{18}$ $cm^{-3}$ is made on an n-type InP substrate 1 with a carrier concentration of $4\times10^{18}$, as shown in FIG. 2, by using the metal organic chemical vapor deposition (MOCVD) method. Further, the epitaxial growth of an n optical wave guide layer 3 consisting of n-type GaInAsP layer with a carrier concentration of $1\times10^{18}$ $cm^{-3}$ and an absorption edge wavelength of 1.3 μm is made on the n cladding layer 2. Further, the epitaxial growth of an optical absorption layer 4 consisting of i-type GaInAsP layer with an absorption edge wavelength of 1.6 μm is made on the n optical wave guide layer 3 as a semiconductor which is non-doped or in which impurities are doped at a low concentration.

For example, the aforementioned n cladding layer 2 is formed so as to have a layer thickness of 0.5 μm, the n optical wave guide layer 3 is formed so as to have a layer thickness of 1 μm, and the optical absorption layer 4 is formed so as to have a layer thickness of 0.1 μm. However, it is preferable that the region with a thickness of about 0.4 μm where the n optical wave guide layer 3 is in contact with the optical absorption layer 4 be non-doped.

Figure 3:
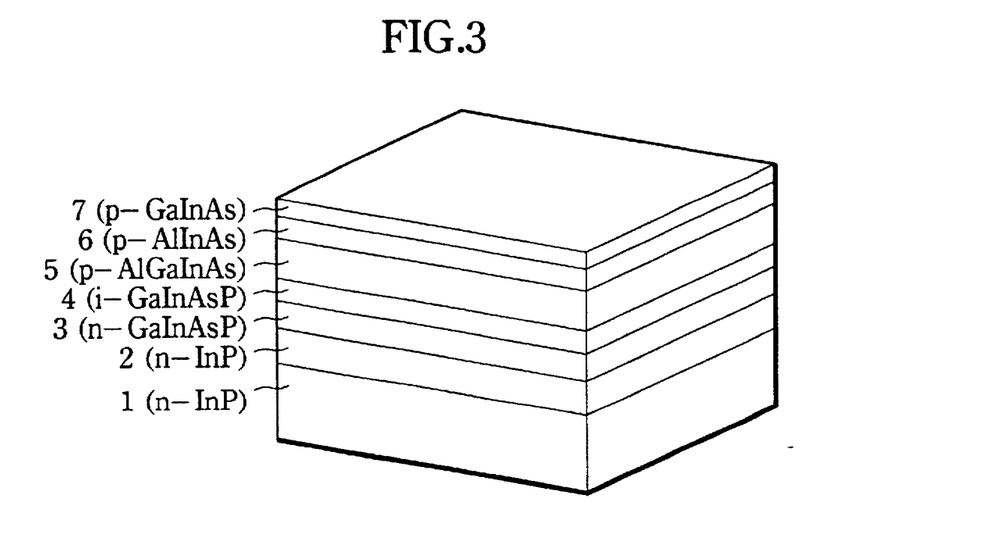
FIG. 3 is a view showing a state of a second stage in the manufacturing process for the photo diode shown in FIG. 1.

Next, as a second stage, the epitaxial growth of a p optical wave guide layer 5 consisting of p-type AlGaInAs with a carrier concentration of $1\times10^{18}$ $cm^{-3}$ and an absorption edge wavelength of 1.4 μm is made on the laminate of semiconductor layers shown in FIG. 2 by using the molecular beam epitaxy (MBE) method. The epitaxial growth of a p cladding layer 6 consisting of AlInAs layer with a carrier concentration of $1\times10^{18}$ $cm^{-3}$ is made on the p optical wave guide layer 5, and further the epitaxial growth of a contact layer 7 consisting of p-type GaInAs layer with a carrier concentration of $2\times10^{19}$ $cm^{-3}$ is made on the p cladding layer 6.

For example, the aforementioned p optical wave guide layer 5 is formed so as to have a layer thickness of 2 μm, the p cladding layer 6 is formed so as to have a layer thickness of 2 μm, and the contact layer 7 is formed so as to have a layer thickness of 0.4 μm. However, it is preferable that the region with a thickness of about 0.4 μm where the p optical wave guide layer 5 is in contact with the optical absorption layer 4 be non-doped.

The reasons why the MBE method is used at the second stage are that a sharp hetero interface can be formed as compared with the aforementioned MOCVD method, and that a semiconductor layer having good lattice matching with the aforementioned optical absorption layer and excellent properties, especially the aforementioned p optical wave guide layer 5, and further the p cladding layer 6 are made to grow by using the fact that the layer thickness control can be performed to the monolayer level.

Figure 4:
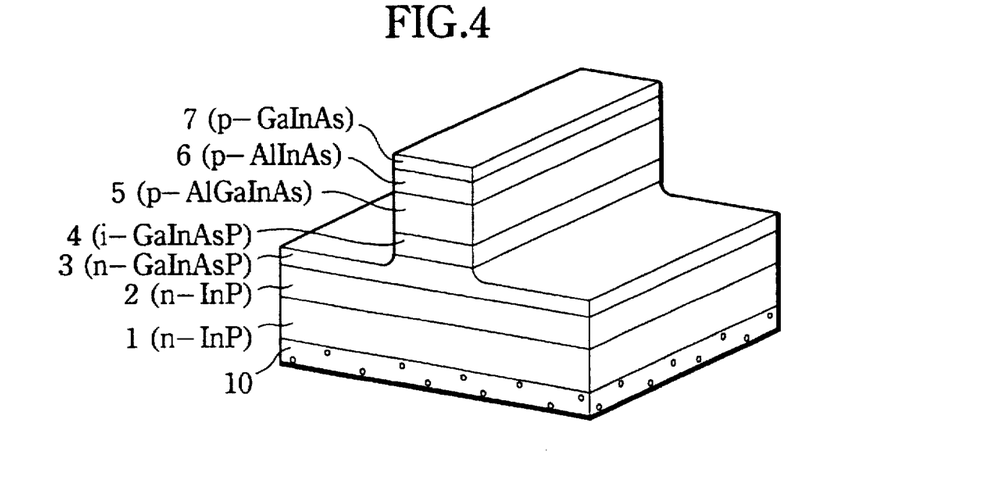
FIG. 4 is a view showing a state of a third stage in the manufacturing process for the photo diode shown in FIG. 1.

Subsequently, as a third stage, the aforementioned contact layer 7, the p cladding layer 6, the p optical wave guide layer 5, the optical absorption layer 4, and the upper half of the n optical wave guide layer 3 are removed in sequence by the lithography method, remaining a stripe-shaped element region with a length of, for example, 200 µm, as shown in FIG. 4.

Next, an insulating layer 8 is formed on both sides of the stripe-shaped region. For example, a polyimide layer or a combination of a silicon nitride and a polyimide layer is used as this insulating layer 8. Further, a resist mask (not shown) is formed on the contact layer 7 of the stripe-shaped region, and an opening is provided on top of the stripe-shaped region using the resist mask. After such an insulating layer 8 is formed, the resist mask is removed. Thereafter, a p-electrode 9 consisting of Ti/Pt/Au layer is formed on the contact layer 7 of the stripe-shaped region and on the insulating layers 8 on both sides of the contact layer 7. After the back surface of the aforementioned n-type InP substrate is ground so that the thickness thereof is about 100 µm, a n-electrode 10 consisting of AuGeNi/Au layer is formed on the back surface of the InP substrate.

Thereafter, the center of the stripe-shaped region is cleaved, and element separation is made, by which the photo diode of an element construction as shown in FIG. 1 is completed.

The absorption edge wavelength of the semiconductor layers composing the optical absorption layer, etc. of the photo diode manufactured as described above relates closely to the bandgap energy of the semiconductor layer. The absorption edge wavelength of the semiconductor layer can be determined as a value obtained by dividing Plank's constant h ($=6.6256\times10^{-34}$ J·s) by the bandgap energy of the semiconductor layer. Therefore, the type of semiconductor layer which is made to grow as the optical absorption layer 4 or the n optical wave guide layer 3 and p optical wave guide layer 5 is determined as a semiconductor which has bandgap energy determined by dividing the aforementioned Plank's constant by the absorption edge wavelength and also has a good composition for lattice matching. In this example, as described above, GaInAsP is determined as the semiconductor layer forming the optical absorption layer 4, and AlGaInAs is determined as the semiconductor layer forming the optical wave guide layers 3 and 5.

The band diagram at the interface between the GaInAsP layer forming the optical absorption layer 4 and AlGaInAs forming the optical wave guide layers 3 and 5, that is, the bandgap energy and the valence band level of each semiconductor layer were studied, with the following result. The study was made based on simulation using a computer and the experiment result of emission from a quantum well using photoluminescence.

This study result will be described below. When the bandgap energy of the AlGaInAs layer is fixed to 0.95 eV and the bandgap energy of the GaInAsP layer which is lattice matched to the InP substrate is changed from 0.75 eV to 1.3 eV, the band diagram of the AlGaInAs layer and the GaInAsP layer changed as shown in FIGS. 5A to 5E. However, FIGS. 5A to 5E show the level of the valence band and conduction band in the AlGaInAs layer and GaInAsP layer, the potential notch and spike etc. being omitted.

Figure 5A:
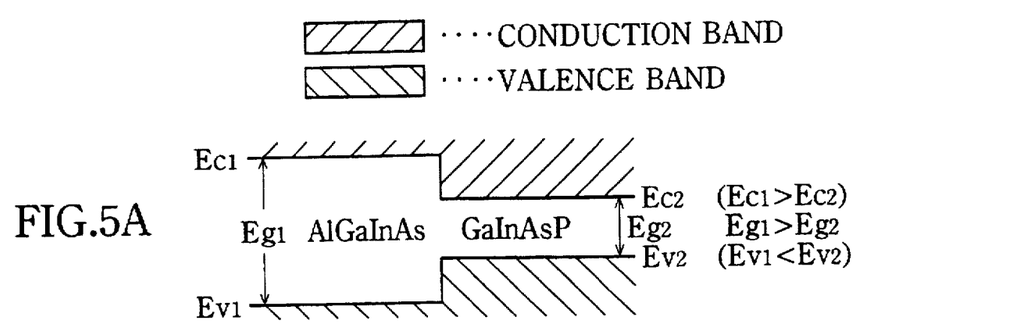
FIG. 5A is a band diagram showing the bandgap energy and the valence band level for AlGaInAs having an absorption edge wavelength of 1.3 μm and GaInAsP having an absorption edge wavelength of 1.65 μm.

As shown in FIG. 5A, when the bandgap energy Eg2 of the GaInAsP layer is lower than the bandgap energy Eg1 of the AlGaInAs layer [Eg1>Eg2], the valence band level Ev1 of the AlGaInAs layer and the valence band level Ev2 of the GaInAsP layer has a relationship of [|Ev1|>|Ev2|]. When the bandgap energy of the GaInAsP layer increases, however, the band offset ΔEv (=|Ev1|−|Ev2|) of valence band decreases gradually and reduces to zero under a given condition as shown in FIG. 5B.

Figures 5B, 5C:
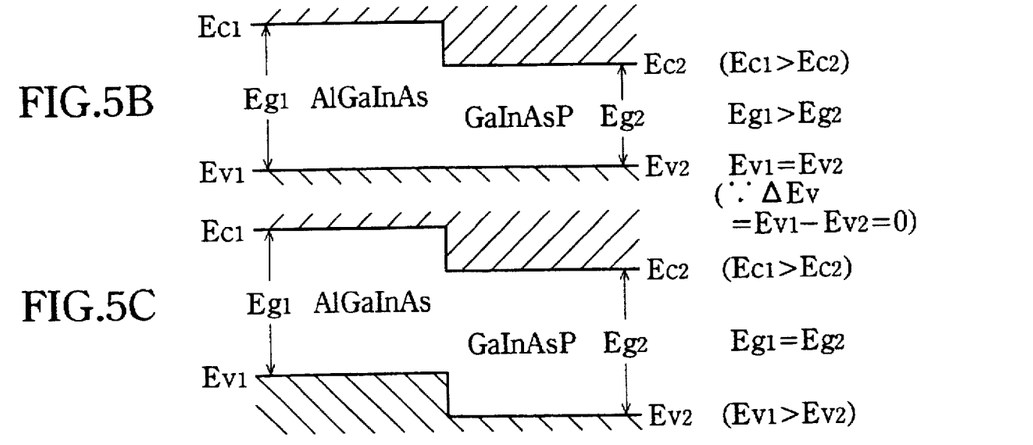
FIG. 5B is a band diagram when the absorption edge wavelength of GaInAsP in FIG. 5A is changed so that the band offset of valence band of AlGaInAs and GaInAsP is zero.
FIG. 5C is a band diagram when the absorption edge wavelength of GaInAsP in FIG. 5B is changed so that the valence band level of AlGaInAs and GaInAsP is reversed.
Figure 5D:
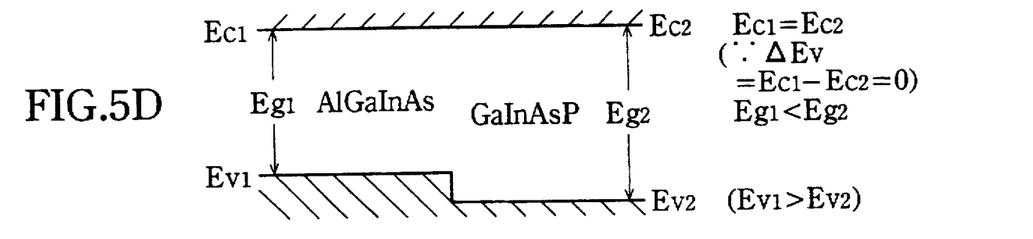
FIG. 5D is a band diagram when the absorption edge wavelength of GaInAsP in FIG. 5C is changed so that the band offset of conduction band of AlGaInAs and GaInAsP is zero.
Figure 5E:
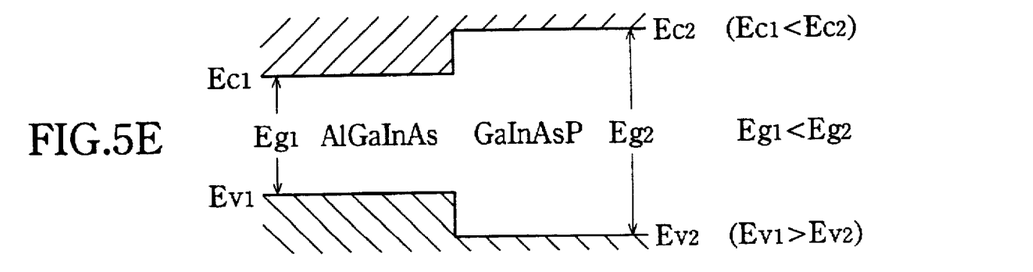
FIG. 5E is a band diagram when the absorption edge wavelength of GaInAsP in FIG. 5D is changed so that the bandgap energy of GaInAsP is larger than that of AlGaInAs.

When the bandgap energy of the GaInAsP layer is further increased from this state to a state of [Eg1=Eg2], the valence band level of each layer becomes a state of [|Ev1|<|Ev2|] as shown in FIG. 5C. When the bandgap energy of the GaInAsP layer is further increased, the level of the conduction band of each layer becomes equal as shown in FIG. 5D [|Ec1|=|Ec2|]. When the bandgap energy of the GaInAsP layer is still further increased [Eg1<Eg2], the level of the conduction band of the GaInAsP layer becomes higher than the level of the conduction band of the AlGaInAs layer [|Ec1|<|Ec2|] as shown in FIG. 5E, and the valence band level of each layer has a relationship of [|Ev1|<|Ev2|].

Figure 6:
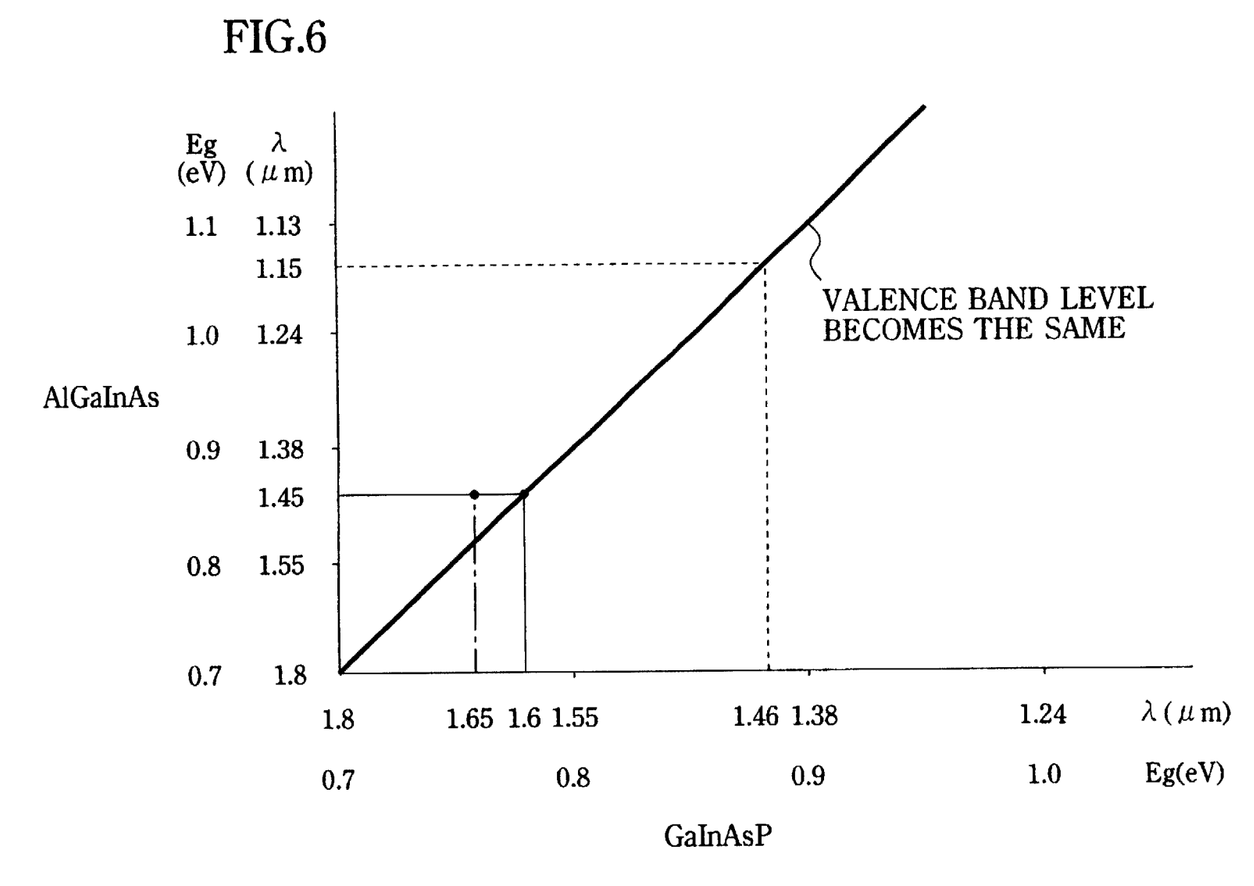
FIG. 6 is a view showing the relationship between the bandgap energy and the absorption edge wavelength of GaInAsP and AlGaInAs, and the condition in which the valence band level of GaInAsP and AlGaInAs is equal.

FIG. 6 shows the relationship of the bandgap energy, and in turn, the absorption edge wavelength of the AlGaInAs layer and GaInAsP layer when the valence band level Ev1 of the AlGaInAs layer is equal to the valence band level Ev2 of the GaInAsP layer and the offset ΔEv becomes zero as shown in FIG. 5B.

For the photo diode manufactured as described above, the absorption edge wavelength or the valence band level of the GaInAsP layer forming the optical absorption layer 4 and the p-type AlGaInAs layer forming the p optical wave guide layer 5 is determined based on the relationship shown in FIG. 6. The hole with a heavy effective mass is subjected to conduction hindrance by the potential spike caused by the band offset to prevent unnecessary pileup at the interface.

For the photo diode manufactured as described above, the optical absorption layer 4 is the i-type GaInAsP layer with an absorption edge wavelength of 1.6 µm, and the p optical wave guide layer 5 adjacent to the optical absorption layer 4 consists of the p-type AlGaInAs layer with an absorption edge wavelength of 1.45 µm, and lattice matches with the InP substrate 1. As is apparent from the relationship shown in FIG. 6, the valence band level of the optical absorption layer 4 consisting of the i-type GaInAsP layer with an absorption edge wavelength of 1.6 µm and the valence band level of the p optical wave guide layer 5 consisting of the p-type AlGaInAs layer with an absorption edge wavelength of 1.45 µm are set so as to be almost equal to each other.

Therefore, in the optical absorption layer 4 to which light is introduced, of the electric charges created by the photoelectric transfer caused by the receipt of the optical energy, the holes with a heavy mass move from the p optical wave guide layer 5 to the p-type cladding layer 5 without being affected by the interface with the p optical wave guide layer 5. That is, the holes move in such a manner that the movement thereof is not hindered at the interface between the optical absorption layer 4 and the p optical wave guide 5, that is, unnecessary pileup is not produced. As a result, distortion is not produced in the signal current outputted via the electrodes 9 and 10, and a distortionless signal current having a good linearity in response to the light receiving signal can be obtained.

Specifically, on the optical wave guide type photo diode, the modulation distortion for light with a wavelength of 1.55 µm was measured, and the characteristics were evaluated. This measurement was made by the optical two tone method (optical heterodyne method) by bringing wave guide photo diode to which a bias voltage of −5V is applied close to a distance of 10 µm from the end face of an optical fiber cut to 8°. The measurement conditions were 250 MHz and 244 MHz of modulation frequencies and 70% of modulation depth. At this time, it was confirmed that the secondary and tertiary intermodulation distortions showed good values, being −90 dBc and −110 dBc, respectively, for an average input power of 0 dBm. This measurement result indicates that an improvement effect of about 20 dB is achieved as compared with the conventional photo diode.

On the other hand, as another embodiment of the present invention, in order to realize a photo diode for detecting light with a wavelength of 1.3 μm, i-type GaInAsP layer with an absorption edge wavelength of 1.46 μm was made to grow as the aforesaid optical absorption layer 4. Also, p-type AlGaInAs layer with an absorption edge wavelength of 1.15 μm was made to grow as the p optical wave guide layer 5 adjacent to this optical absorption layer 4. However, other semiconductor layers were the same as those in the above-described embodiment.

For the wave guide photo diode having the optical absorption layer 4 and the p optical wave guide layer, as shown in FIG. 6, the valence band level of the optical absorption layer 4 consisting of i-type GaInAsP layer of an absorption edge wavelength of 1.46 μm is nearly equal to the level of valence band of the optical absorption layer 5 consisting of p-type AlGaInAs layer with an absorption edge wavelength of 1.15 μm.

Therefore, even on the optical wave guide type photo diode for the wavelength of 1.3 μm, the unnecessary pileup of holes is not produced at the interface between the optical absorption layer 4 and the p optical wave guide layer. A distortionless signal current having a good linearity in response to the light receiving signal was be obtained. Specifically, the modulation distortion for light with a wavelength of 1.3 μm on the aforementioned optical wave guide type photo diode was investigated in the same way as the preceding embodiment. When the measurement conditions were the same, it was confirmed that the secondary and tertiary intermodulation distortions showed good values, being −80 dBc and −105 dBc, respectively.

Also, as still another embodiment of the present invention, in order to realize a photo diode for detecting light with a wavelength of 1.5 μm, i-type GaInAs layer with an absorption edge wavelength of 1.65 μm was made to grow as the aforesaid optical absorption layer 4. Also, p-type AlGaInAs layer with an absorption edge wavelength of 1.4 μm was made to grow as the p optical wave guide layer 5 adjacent to this optical absorption layer 4. However, other semiconductor layers were the same as those in the above-described embodiment.

In this case, as shown in FIG. 6, the level of valence band of the optical absorption layer 4 consisting of i-type GaIn-AsP layer with an absorption edge wavelength of 1.65 μm slightly shifted from the level of valence band of the optical absorption layer 5 consisting of p-type AlGaInAs layer with an absorption edge wavelength of 1.45 μm. However, the difference in the level was small, and the unnecessary pileup of holes at the interface between the optical absorption layer 4 and the p optical wave guide layer 5 was inhibited significantly. As a result, a signal current scarcely producing distortion in response to the light receiving signal was be obtained.

The present invention can be applied not only to the optical wave guide type photo diode as shown above embodiments but also to the face incident type photo diode. That is, since the optical wave guide type photo diode introduces light in parallel with the semiconductor layer which is made to grown epitaxially and absorbs light while guiding the incident light, it has an advantage that the local concentration of optical absorption is less prone to occur and the distortion is small. Also, the running distance of carrier created by photoelectric transfer is short, so that the distortion is small for this reason as well.

However, if the thickness of the optical absorption layer is decreased to an extent that the light receiving sensitivity is not deteriorated to shorten the running distance of carrier, and the incident range is widened to the utmost, a highly sensitive face incident type photo diode can be realized. In this case as well, assuming that there is scarcely a difference in valence band level, as described above, as the p semiconductor layer adjacent to the optical absorption layer, the cause for preventing the flow of holes can be eliminated, and the distortion of signal current can be inhibited as in the above-described embodiments.

Figure 7:
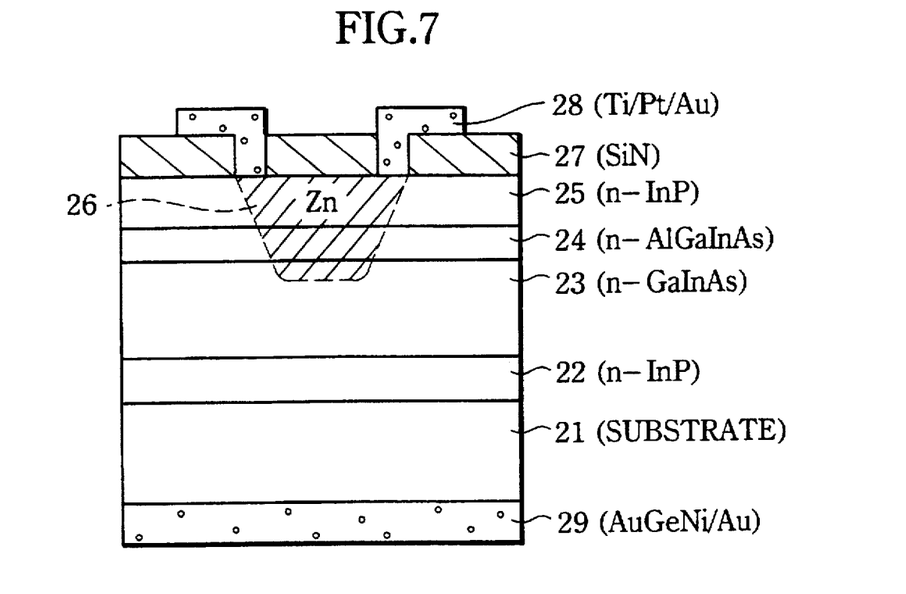
FIG. 7 is a view showing a construction of a photo diode in accordance with another embodiment of the present invention.

FIG. 7 shows an embodiment in which the present invention is applied to a surface-incident photo diode. This photo diode is manufactured, as a first stage, by making an n-type InP buffer layer 22 with a carrier concentration of $1\times10^{18}$ cm$^{-3}$, an n-type GaInAs optical absorption layer 23 with a carrier concentration of $1\times10^{15}$ cm$^{-3}$, a n-type AlGaInAs low-distortion insertion layer 24 with a carrier concentration of $1\times10^{17}$ cm$^{-3}$ and an absorption edge wavelength of 1.45 μm, and an n-type InP cap layer 25 with a carrier concentration of $1\times10^{17}$ cm$^{-3}$ grow epitaxially in that order on a n-type InP substrate 21 with a carrier concentration of $1\times10^{18}$ cm$^{-3}$. The epitaxial growth of these layers is made by the MOCVD method while making the lattice matching with respect to the n-type InP substrate. For example, the layer thickness of the n-type InP buffer layer 22 is 0.5 μm, that of the n-type GaInAs optical absorption layer 23 is 1.5 μm, that of the n-type AlGaInAs low-distortion insertion layer 24 is 0.5 μm, and that of the n-type InP cap layer 25 is 3 nm.

Thereafter, as a second stage, Zn is diffused, for example, to an intermediate position of the n-type GaInAs optical absorption layer 23 of the above-mentioned semiconductor multilayer, and this Zn diffusion region is inverted to form a P-type Zn diffusion region 26. Then an SiN layer is formed as a passivation layer 27 on the semiconductor multilayer. The passivation layer 27 located on the p-type Zn diffusion region 26 is removed, for example, into a ring shape, and a ring-shaped p-electrode 28 is formed on the removed portion. The diameter of this ring is, for example, 50 μm, and Ti/Pt/Au is used as the p-electrode 28. Thereafter, the n-type InP substrate 21 is ground to a thickness of about 140 μm to adjust the thickness, and a n-electrode 29 is formed on the back surface of the substrate. AuGeNi/Au is used as the n-electrode 29.

According to the surface-incident photo diode thus manufactured, the n-type InP cap layer 25 functions as an oxidation preventive layer for the n-type AlGaInAs low-distortion insertion layer 24. Since the layer thickness of the n-type InP cap layer 25 is as small as 3 nm, however, the decrease in light receiving sensitivity, deterioration in current/voltage characteristics, and increase in modulation distortion are not caused.

When light was incidented on the top surface of this photo diode, light receiving sensitivity over 0.9 A/W was obtained for the light with a wavelength of 1.0 to 1.6 μm. Especially when an electric charge produced in the n-type GaInAs optical absorption layer 23 was conducted, the occurrence of surface recombination current in the n-type AlGaInAs low-distortion insertion layer 24 was inhibited, so that high light receiving sensitivity was obtained even for the light with a short wavelength.

The light from an optical fiber cut to 8° was condensed via a lens and incidented on this surface-incident photo diode to make a characteristic test. At this time, the focal point was shifted intentionally so that the light was irradiated uniformly to the whole in the ring region of 50 μm in diameter. A bias voltage of −10V was applied, and the modulation distortion was measured under the same measurement conditions as those in the above-described embodiment. As a result, it was confirmed that the secondary and tertiary intermodulation distortions showed good values, being −75 dBc and −100 dBc, respectively, for an average input power of 0 dBm.

The present invention is not limited to the above embodiments. Although semiconductor layers are formed by the MOCVD method or the MBE method in the above embodiments, the gas source MBE method or CBE (chemical beam epitaxy) method may be used to make a semiconductor layer grow. In particular, all semiconductor layers may be made to grow by the MOCVD method. In this case, it is preferable to use an InP layer as a cladding layer. Also, non-doped or low-concentration doped GaInAs can be used as the optical absorption layer, and further AlGaInAs can be used as the p semiconductor layer adjacent to the optical absorption layer.

What is claimed is:

1. A photo diode of pin construction, comprising an optical absorption layer consisting of a GaInAsP layer and a p-type semiconductor layer consisting of a p-type AlGaInAs layer adjacent to the optical absorption layer.

2. A photo diode according to claim 1, wherein the difference in valence band offset between the optical absorption layer consisting of a GaInAsP layer and the p-type semiconductor layer consisting of a p-type AlGaInAs layer adjacent to the optical absorption layer is set so as to be smaller than 0.05 eV.

3. A photo diode according to claim 2, wherein the optical absorption layer consists of a GaInAsP layer with an absorption edge wavelength of 1.65 to 1.55 μm, and the p-type semiconductor layer consists of a p-type AlGaInAs layer with an absorption edge wavelength of 1.55 to 1.30 μm and shorter than that of the optical absorption layer.

4. A photo diode according to claim 2, where in the optical absorption layer consists of a GaInAsP layer with an absorption edge wavelength of 1.56 to 1.36 μm, and the p-type semiconductor layer consists of a p-type AlGaInAs layer with an absorption edge wavelength of 1.30 to 1.14 μm.

5. A photo diode according to any claim 1, which is of an optical wave guide construction.

6. A photo diode of pin construction, comprising:
   an n-type InP substrate;
   an n cladding layer consisting of an n-type InP layer or an n-type AlInAs layer formed on the n-type InP substrate, the n cladding layer lattice matching with the n-type InP substrate;
   an n optical wave guide layer consisting of an n-type GaInAsP layer or an n-type AlGaInAs layer formed on the n cladding layer, the n-type GaInAsP layer or n-type AlGaInAs layer not absorbing light with a wavelength of 1.55 μm, and lattice matching with the n InP substrate;
   an optical absorption layer consisting of a non-doped or low-concentration doped GaInAs layer or GaInAsP layer formed on the n optical wave guide layer, the GaInAs layer or GaInAsP layer absorbing light with a wavelength of 1.55 μm, and lattice matching with the n optical wave guide layer;
   a p-optical wave guide layer consisting of a p-type GaInAsP layer or a p-type AlGaInAs layer formed on the optical absorption layer, the p-type GaInAsP layer or p-type AlGaInAs layer not absorbing light with a wavelength of 1.55 μm, and lattice matching with the optical absorption layer; and
   a p cladding layer consisting of a p-type InP layer or a p-type AlInAs layer formed on the p optical wave guide layer, the p-type InP layer or p-type AlInAs layer not absorbing light with a wavelength of 1.55 μm, and lattice matching with the p optical wave guide layer,
   wherein light is incident in parallel with each layer.

7. A photo diode of pin construction, comprising:
   an n-type InP substrate;
   an n cladding layer consisting of an n-type InP layer or an n-type AlInAs layer formed on the n-type InP substrate;
   an n optical wave guide layer consisting of an n-type GaInAsP layer or an n-type AlGaInAs layer formed on the n cladding layer, the n-type GaInAsP layer or n-type AlGaInAs layer not absorbing light with a wavelength of 1.3 μm, and lattice matching with the n InP substrate;
   an optical absorption layer consisting of a non-doped or n-type low-concentration doped GaInAs layer or GaInAsP layer formed on the n optical wave guide layer, the GaInAs layer or GaInAsP layer absorbing light with a wavelength of 1.3 μm, and lattice matching with the n optical wave guide layer;
   a p optical wave guide layer consisting of a p-type GaInAsP layer or a p-type AlGaInAs layer formed on the optical absorption layer, the p-type GaInAsP layer or p-type AlGaInAs layer not absorbing light with a wavelength of 1.3 μm, and lattice matching with the optical absorption layer; and
   a p cladding layer consisting of a p-type InP layer or a p-type AlInAs layer formed on the p optical wave guide layer, the p-type InP layer or p-type AlInAs layer not absorbing light with a wavelength of 1.3 μm, and lattice matching with the p optical wave guide layer,
   wherein light is incident in parallel with each layer.

8. A photo diode according to claim 1, which is of a surface incident type, comprising:
   an n-type InP substrate;
   an optical absorption layer consisting of a non-doped or n-type low-concentration doped GaInAs layer or GaInAsP layer formed on the n-type InP substrate;
   an AlGaInAs layer with an absorption edge wavelength of 1.55 to 1.14 μm formed on the optical absorption layer; and
   a p-type region formed in the AlGaInAs layer, the p-type region being formed by diffusion or implant doping of p-type impurities.

9. A photo diode according to claim 2, which is of an optical wave guide construction.

10. A photo diode according to claim 3, which is of an optical wave guide construction.

11. A photo diode according to claim 4, which is of an optical wave guide construction.

12. A photo diode according to claim 2, which is of a surface incident type, comprising:
   an n-type InP substrate;
   an optical absorption layer consisting of a non-doped or n-type low concentration doped GaInAs layer or GaInAsP layer formed on the n-type InP substrate;
   an AlGaInAs layer with an absorption edge wavelength of 1.55 to 1.14 μm formed on the optical absorption layer; and a p-type region formed in the AlGaInAs layer, the p-type region being formed by diffusion or implant doping of p-type impurities.

13. A photo diode according to claim 3, which is of a surface incident type, comprising:

an n-type InP substrate;

an optical absorption layer consisting of a non-doped or n-type low concentration doped GaInAs layer or GaInAsP layer formed on the n-type InP substrate;

an AlGaInAs layer with an absorption edge wavelength of 1.55 to 1.14 μm formed on the optical absorption layer; and a p-type region formed in the AlGaInAs layer, the p-type region being formed by diffusion or implant doping of p-type impurities.

14. A photo diode according to claim 3, which is of a surface incident type, comprising:

an n-type InP substrate;

an optical absorption layer consisting of a non-doped or n-type low concentration doped GaInAs layer or GaInAsP layer formed on the n-type InP substrate;

an AlGaInAs layer with an absorption edge wavelength of 1.55 to 1.14 μm formed on the optical absorption layer; and a p-type region formed in the AlGaInAs layer, the p-type region being formed by diffusion or implant doping of p-type impurities.

* * * * *